United States Patent
Choi et al.

(10) Patent No.: US 12,429,777 B2
(45) Date of Patent: Sep. 30, 2025

(54) PHOTORESIST STRIPPER COMPOSITION FOR MANUFACTURING DISPLAY

(71) Applicant: LTC CO., LTD., Hwaseong-si (KR)

(72) Inventors: Ho Sung Choi, Seongnam-si (KR); Kyu Sang Kim, Anyang-si (KR); Jong Soon Lee, Suwon-si (KR); Sang Ku Ha, Incheon (KR); Byeong Woo Jeon, Seoul (KR); Yun Mo Yang, Suwon-si (KR); Ki Cheon Byun, Icheon-si (KR); Yeon Soo Choi, Seongnam-si (KR); Seon Jeong Kim, Seoul (KR)

(73) Assignee: LTC CO., LTD., Hwaseong-si (KR)

( * ) Notice: Subject to any disclaimer, the term of this patent is extended or adjusted under 35 U.S.C. 154(b) by 672 days.

(21) Appl. No.: 17/774,737

(22) PCT Filed: Nov. 18, 2020

(86) PCT No.: PCT/KR2020/016225
§ 371 (c)(1),
(2) Date: May 5, 2022

(87) PCT Pub. No.: WO2021/101227
PCT Pub. Date: May 27, 2021

(65) Prior Publication Data
US 2022/0404710 A1 Dec. 22, 2022

(30) Foreign Application Priority Data

Nov. 21, 2019 (KR) .................. 10-2019-0150198

(51) Int. Cl.
| | | |
|---|---|---|
| C11D 3/30 | (2006.01) | |
| C11D 3/00 | (2006.01) | |
| C11D 3/20 | (2006.01) | |
| C11D 3/28 | (2006.01) | |
| C11D 7/08 | (2006.01) | |
| C11D 7/26 | (2006.01) | |
| C11D 7/32 | (2006.01) | |
| C11D 7/36 | (2006.01) | |
| G03F 7/42 | (2006.01) | |

(52) U.S. Cl.
CPC ............ *G03F 7/425* (2013.01); *C11D 3/0073* (2013.01); *C11D 3/2068* (2013.01); *C11D 3/2096* (2013.01); *C11D 3/28* (2013.01); *C11D 3/30* (2013.01); *C11D 7/263* (2013.01); *C11D 7/3218* (2013.01); *C11D 7/3281* (2013.01)

(58) Field of Classification Search
CPC ....... C11D 3/2068; C11D 3/2096; C11D 3/30; C11D 3/28; C11D 3/0073; C11D 7/263; C11D 7/3218; C11D 7/3281
USPC ................ 510/175, 176, 499, 500, 505, 506
See application file for complete search history.

(56) References Cited

U.S. PATENT DOCUMENTS

| | | | | |
|---|---|---|---|---|
| 9,944,827 | B2 * | 4/2018 | Mishima | ............. H01L 21/3212 |
| 2011/0318929 | A1 | 12/2011 | Mishima et al. | |
| 2013/0035272 | A1 * | 2/2013 | Lee | .......... G03F 7/425 |
| | | | | 510/176 |
| 2013/0116159 | A1 * | 5/2013 | Pollard | ................... G03F 7/426 |
| | | | | 510/176 |
| 2017/0037344 | A1 * | 2/2017 | Chang | .................. C11D 7/5013 |
| 2018/0239256 | A1 * | 8/2018 | Choi | ..................... H10D 86/60 |

FOREIGN PATENT DOCUMENTS

| | | | | |
|---|---|---|---|---|
| CN | 1175286 | A | 3/1998 | |
| CN | 101824621 | A | 9/2010 | |
| CN | 107193188 | A | 9/2017 | |
| CN | 107924144 | A | 4/2018 | |
| EP | 1612858 | A2 * | 1/2006 | ......... C11D 11/0047 |
| EP | 1736534 | A1 * | 12/2006 | ......... C11D 11/0047 |
| EP | 2290046 | A1 * | 3/2011 | ......... C11D 11/0047 |
| EP | 2500407 | A1 * | 9/2012 | ......... C11D 11/0047 |
| JP | 2012-182158 | A | 9/2012 | |
| JP | 2013-042123 | A | 2/2013 | |
| KR | 10-1089211 | B1 | 11/2011 | |
| KR | 10-2014-0044728 | A | 4/2014 | |
| KR | 10-2017-0019871 | A | 2/2017 | |
| WO | 1996020295 | A1 | 7/1996 | |
| WO | WO-0011091 | A1 * | 3/2000 | ............... C09D 9/00 |
| WO | 2008140076 | A1 | 11/2008 | |
| WO | 2016-006631 | A1 | 1/2016 | |
| WO | WO-2019083643 | A1 * | 5/2019 | ............... B08B 3/10 |

OTHER PUBLICATIONS

International Search Report and Written Opinion issued in connection with PCT Application No. PCT/KR2020/016225, dated Nov. 18, 2020.
EESR for EP application No. EP20889800.7, dated Nov. 27, 2023, 10 pages.
Office Action for CN application No. 202080078373.4, dated Apr. 16, 2025, 8 pages.

\* cited by examiner

*Primary Examiner* — Gregory R Delcotto
(74) *Attorney, Agent, or Firm* — Tarolli, Sundheim, Covell &Tummino LLP

(57) ABSTRACT

The present invention relates to a photoresist stripper composition for manufacturing a display, and more particularly, to an integrated photoresist stripper composition which can be used in every process for manufacturing a display. More specifically, the photoresist stripper composition for manufacturing a display according to the present invention can be applied to all of transition metals and oxide semiconductor wirings, and has an excellent ability to remove modified photoresist after a hard bake process, and implant process, and a dry etch process have been performed. In particular, the photoresist stripper composition for manufacturing a display according to the present invention exhibits a corrosion inhibitory effect that has been further specialized for copper (Cu) wiring pattern edge portions which are susceptible to corrosion following dry-etching.

6 Claims, 1 Drawing Sheet

[FIG. 1]
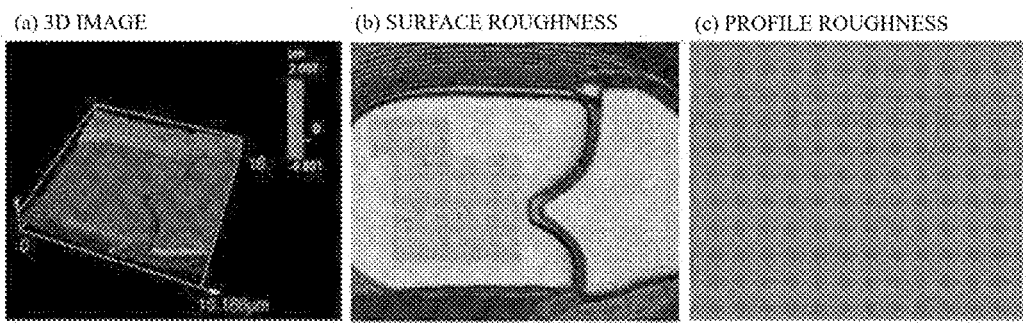
[FIG. 2]
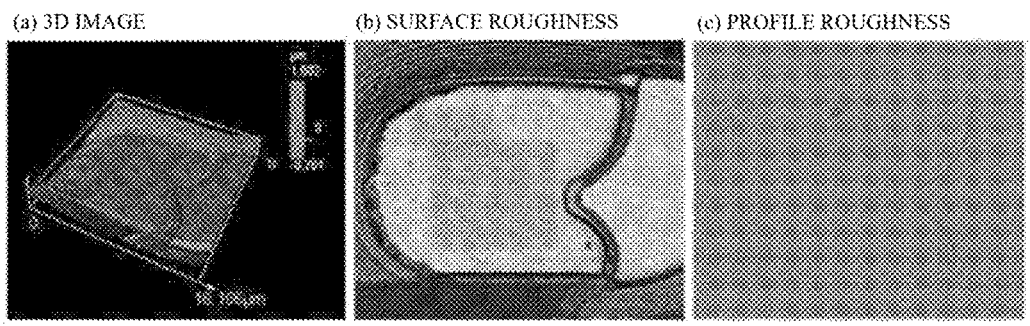

PHOTORESIST STRIPPER COMPOSITION FOR MANUFACTURING DISPLAY

RELATED APPLICATIONS

The present invention is a U.S. National Stage under 35 USC 371 patent application, claiming priority to Serial No. PCT/KR2020/016225, filed on Nov. 18, 2020; which claims priority from Korean Patent Application No. 10-2019-0150198 filed on Nov. 21, 2019; the entireties of both are hereby incorporated herein by reference.

TECHNICAL FIELD

The present invention relates to a photoresist stripper composition for manufacturing a display, and more particularly, to a composition for an integrated photoresist stripper which can be used in all processes for manufacturing a display. More specifically, the photoresist stripper composition for manufacturing a display of the present invention can be applied to all of a transition metal, and an oxide semiconductor wiring, and have an excellent ability to remove modified photoresists generated after a hard bake process, an implant process, and a dry etching process. Particularly, after dry etching, it shows a more specialized corrosion inhibitory effect on a pattern edge part of copper (Cu) wiring, which is vulnerable to corrosion.

TECHNICAL FIELD

In a process of manufacturing a flat panel display (FPD), a photolithography process is widely used to form a uniform pattern on a substrate. Such a photolithography process largely consists of a series of processes such as an exposure process, a dry or wet etching process, and an ashing process, and a pattern is formed by applying a photoresist on a substrate, exposing the photoresist, and performing dry or wet etching thereon. Here, the photoresist remaining on metal wiring has to be removed using a photoresist stripper.

In the early days of using the stripper, the use of an organic stripper was common, but since then, as a stronger stripping ability is required during the process, aqueous strippers containing water have been used. An aqueous stripper provides a strong stripping ability, but has a problem in that the aqueous stripper causes metal wiring to be vulnerable to corrosion.

Particularly, after dry etching, higher corrosion prevention performance is required for a pattern edge part of Cu wiring, which is vulnerable to corrosion. This is because, when mainly used alkanolamines are mixed with water, hydroxide ions are generated and corrosiveness for metals including copper and aluminum considerably increases. Therefore, special corrosion inhibitors have been required to prevent the corrosion of metal wiring.

To solve the above-described problems, many corrosion inhibitors have been investigated, and among these, the most commonly used corrosion inhibitor is a sulfur-based azole compound. However, after etching, the performance of a sulfur-based azole compound tends to deteriorate at the pattern edge part of Cu wiring, and there is a possibility that sulfur can be precipitated or resorbed.

In the future, the above-described pattern will be developed into a finer pattern, and therefore, higher anti-corrosion ability and excellent stripping ability are required. Particularly, due to the above problems, there is a demand for a non-sulfur-based corrosion inhibitor to replace a sulfur-based azole compound.

The inventors found that a compound with a specific chemical structure has the above-described effects while studying a non-sulfur-based corrosion inhibitor which has superior corrosion inhibiting performance and maintains an excellent stripping ability at the pattern edge part of the Cu wiring, which is vulnerable to corrosion, after dry etching, and thus the present invention was completed.

RELATED ART DOCUMENTS

Patent Documents (Patent Document 1) Korean Registration Patent No. 10-1089211
(Patent Document 2) Korean Publication Patent No. 10-2017-0019871

DISCLOSURE

Technical Problem

The present invention is directed to providing a photoresist stripper composition for manufacturing a display, which solves the above-described problems of a sulfur-based corrosion inhibitor.

The present invention is also directed to providing a photoresist stripper composition for manufacturing a display, which has excellent anti-corrosion ability and excellent stripping ability with respect to copper (Cu), aluminum (Al) and metal oxide wirings regardless of a water content, and particularly, to a composition of photoresist stripper, which includes a non-sulfur-based corrosion inhibitor that can be applied to a pattern edge part of the copper (Cu) wiring, which is vulnerable to corrosion, after dry etching.

Technical Solution

To achieve the above-described purposes, the present invention provides a photoresist stripper composition, which includes a non-sulfur-based compound that replaces a sulfur-based azole compound and has excellent anti-corrosion ability and excellent stripping ability compared to existing photoresist stripper compositions.

Specifically, according to one embodiment of the present invention, the present invention provides the following photoresist stripper composition for manufacturing a display:

(a) 0.01 to 3 wt % of a transition metal and metal oxide corrosion inhibitor of Formula 1 below;
(b) 0.05 to 3 wt % of a non-sulfur-based corrosion inhibitor of Formula 2 below;
(c) 1 to 10 wt % of a mixture of a primary amine and a secondary amine;
(d) 1 to 15 wt % of a cyclic alcohol;
(e) 1 to 30 wt % of an aprotic polar organic solvent;
(f) 1 to 30 wt % of a protic polar organic solvent; and
(g) deionized water as the remainder:

<Formula 1>

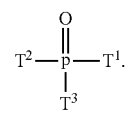

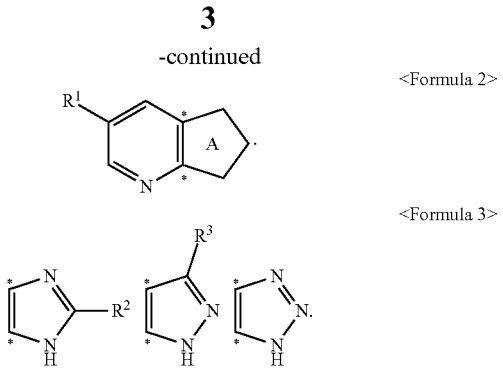

Here, $T^1$ and $T^2$ are each independently $-O^-NH_4^+$ or $-O-H$;

$T^3$ is $-O-R$ or $-R'$;

R and R' are each independently selected from the group consisting of hydrogen, methyl, a linear or branched $C_2$ to $C_{12}$ alkyl group, a linear or branched $C_2$ to $C_{12}$ alkenyl group, a linear or branched $C_2$ to $C_{12}$ alkynyl group, a $C_3$ to $C_{12}$ cycloalkyl group, a heterocycloalkyl group having 3 to 10 nuclear atoms, which includes one or more hetero atoms selected from the group consisting of N, O and S, a $C_6$ to $C_{20}$ aryl group, a heteroaryl group having 5 to 20 nuclear atoms, which includes one or more hetero atoms selected from the group consisting of N, O and S, a $C_1$ to $C_{12}$ alkyloxy group, and a $C_6$ to $C_{12}$ aryloxy group;

ring A of Formula 2 is any one of the structures of Formula 3;

$R^1$, $R^2$ and $R^3$ are selected from the group consisting of methyl, a linear or branched $C_2$ to $C_{12}$ alkyl group, a linear or branched $C_2$ to $C_{12}$ alkenyl group, a linear or branched $C_2$ to $C_{12}$ alkynyl group, a $C_3$ to $C_{12}$ cycloalkyl group, a heterocycloalkyl group having 3 to 10 nuclear atoms, which includes one or more hetero atoms selected from the group consisting of N, O and S, a $C_6$ to $C_{20}$ aryl group, a heteroaryl group having 5 to 20 nuclear atoms, which includes one or more hetero atoms selected from the group consisting of N, O and S, a $C_1$ to $C_{12}$ alkyloxy group, and a $C_6$ to $C_{12}$ aryloxy group; and

* indicates carbon fusing a pyridine ring of Formula 2 and ring A.

According to one embodiment of the present invention, the transition metal and metal oxide corrosion inhibitor is one or more selected from the group consisting of monoammonium phosphate, diammonium phosphate, triammonium phosphate, methylphosphonic acid, ethylphosphonic acid, propylphosphonic acid, butylphosphonic acid, tert-butyl phosphonic acid, pentyphosphonic acid, n-hexylphosphonic acid, triethyl phosphate, octylphosphonic acid, decylphosphonic acid, dodecylphosphonic acid, tetradecylphosphonic acid, octadecylphosphonic acid, hexylphosphate, heptylphosphate, octylphosphate, nonylphosphate, decylphosphate, and dodecylphosphate, but the present invention is not limited thereto.

According to one embodiment of the present invention, the non-sulfur-based corrosion inhibitor is any one or more selected from the group consisting of imidazo[4,5-b]pyridine, 6-methylimidazo[4,5-b]pyridine, imidazo[4,5-b]pyridine-2-carboxylic acid, 6-methylimidazo[4,5-b]pyridine-2-carboxylic acid, 1H-pyrazolo[3,4-b]pyridine, 3-methyl-1H-pyrazolo[3,4-b]pyridine, 1H-pyrazolo[3,4-b]pyridine-3-carboxylic acid, 5-methyl-1H-pyrazolo[3,4-b]pyridine-3-carboxylic acid, 1H-1,2,3-triazolo[4,5-b]pyridine, 6-methyl-3H-1,2,3-triazolo[4,5-b]pyridine, 3H-1,2,3-triazolo[4,5-b]pyridine-6-carboxylic acid, and 3-methyl-3H-1,2,3-triazolo[4,5-b]pyridine-6-carboxylic acid, but the present invention is not limited thereto.

According to one embodiment of the present invention, the primary amine is selected from the group consisting of monoethanol amine, monoisopropanol amine, 2-amino-2-methyl-1-propanol, aminoethoxyethanol, and a mixture thereof, but the present invention is not limited thereto.

According to one embodiment of the present invention, the secondary amine is selected from the group consisting of 2-acetyl ethanol amine, diethanol amine, 2-methylaminoethanol, 2-isopropylaminoethanol, and a mixture thereof, but the present invention is not limited thereto.

According to one embodiment of the present invention, the content of the primary amine in the mixture of the primary amine and the secondary amine is less than 3 wt % based on the total weight of the composition.

According to one embodiment of the present invention, the cyclic alcohol is selected from the group consisting of tetrahydrofurfuryl alcohol, furfuryl alcohol, isopropylidene glycerol, and a mixture thereof, but the present invention is not limited thereto.

According to one embodiment of the present invention, the aprotic polar organic solvent is selected from the group consisting of dimethyl propionamide, sulfolane, ethylformamide, Equamide, 1,3-dimethyl-2-imidazolidinone, 2-pyrrolidion, 1-formylpiperidine, and a mixture thereof, but the present invention is not limited thereto.

According to one embodiment of the present invention, the protic polar organic solvent is any one or more selected from the group consisting of ethylene glycol, propylene glycol, diethylene glycol monoethyl ether, diethylene glycol monobutyl ether (BDG), diethylene glycol monomethyl ether, ethylene glycol monoethyl ether, ethylene glycol monobutyl ether, propylene glycol monomethyl ether, propylene glycol monoethyl ether, propylene glycol monobutyl ether, diethylene glycol monoethyl ether, diethylene glycol monopropyl ether, diethylene glycol monobutyl ether, dipropylene glycol monomethyl ether, dipropylene glycol monoethyl ether, dipropylene glycol monopropyl ether, dipropylene glycol monobutyl ether, triethylene glycol monopropyl ether, triethylene glycol monobutyl ether, triethylene glycol monomethyl ether, tripropylene glycol monoethyl ether, tripropylene glycol monopropyl ether, and tripropylene glycol monobutyl ether, but the present invention is not limited thereto.

Advantageous Effects

The present invention provides a stripper composition that replaces an existing corrosion inhibitor, such as a sulfur-based azole compound, with a non-sulfur-based compound of the present invention and has excellent anti-corrosion ability and excellent stripping ability with respect to copper (Cu), aluminum (Al) and metal oxide wirings regardless of a water content. This composition imparts excellent anti-corrosion ability and excellent stripping ability, particularly, compared to the pattern edge part of the copper (Cu) wiring, which is vulnerable to corrosion after dry etching.

DESCRIPTION OF DRAWINGS

FIG. 1 shows the (a) three-dimensional image, (b) surface roughness, and (c) profile roughness, which are measured using a high-performance roughness meter (confocal microscope) to confirm the metal corrosion performance of an example according to one embodiment of the present invention.

FIG. 2 shows the (a) three-dimensional image, (b) surface roughness, and (c) profile roughness, which are measured using a high-performance roughness meter (confocal microscope) to confirm the metal corrosion performance of a comparative example of the present invention.

MODES OF THE INVENTION

Examples of the present invention are provided to more completely explain the present invention to those of ordinary skill in the art, and the following examples may be modified in a variety of other forms, and the scope of the present invention is not limited to the following examples. Rather, these examples make the disclosure more thorough and complete, and will be provided to fully convey the spirit of the present invention to those of ordinary skill in the art.

In addition, in the drawings, the thickness or size of each layer is exaggerated for convenience and clarity of description, and in the drawings, like reference numerals refer to like elements. As used in the specification, the term "and/or" includes any one of the corresponding listed items and one or more combinations thereof.

The terms used in the specification are used to explain specific examples, and the present invention is not limited thereto. As used in the specification, a singular form may include a plural form unless clearly indicated otherwise in the context. In addition, "comprise" and/or "comprising" used herein specifies the presence of cited shapes, numbers, steps, actions, members, elements and/or a group thereof, and does not exclude the presence or addition of one or more shapes, numbers, actions, members, elements and/or groups.

The "alkyl" used herein refers to a monovalent substituent derived from a linear or branched saturated hydrocarbon having 1 to 10 carbon atoms. Examples of the alkyl may include methyl, ethyl, propyl, isobutyl, sec-butyl, pentyl, iso-amyl, and hexyl, but the present invention is not limited thereto.

The "alkenyl" used herein refers to a monovalent substituent derived from a linear or branched unsaturated hydrocarbon having 2 to 10 carbon atoms, which includes one or more C—C double bonds. Examples of the alkenyl may include vinyl, allyl, isopropenyl, and 2-butenyl, but the present invention is not limited thereto.

The "alkynyl" used herein refers to a monovalent substituent derived from a linear or branched unsaturated hydrocarbon having 2 to 10 carbon atoms, which includes one or more C—C triple bonds. Examples of the alkynyl may include ethynyl and 2-propynyl, but the present invention is not limited thereto.

The "aryl" used herein refers to a monovalent substituent derived from an aromatic hydrocarbon having 6 to 20 carbon atoms, which has a single ring or a combination of two or more rings. In addition, two or more rings may be pendent, or condensed with each other. Examples of the aryl may include phenyl, naphthyl, phenanthryl, and anthryl, but the present invention is not limited thereto.

The "heteroaryl" used herein refers to a monovalent substituent derived from a monoheterocyclic or polyheterocyclic aromatic hydrocarbon having 5 or 20 nuclear atoms. Here, one or more carbons, and preferably, 1 to 3 carbons of a ring are substituted with a hetero atom such as N, O, S or Se. In addition, 2 or more rings may be pendent, condensed with each other, or condensed with an aryl group. More specifically, the heteroaryl is defined as a heteroaryl group having 5 to 20 nuclear atoms, which includes one or more hetero atoms selected from the group consisting of N, O and S. Examples of the heteroaryl may include 6-membered monocyclic rings such as pyridyl, pyrazinyl, pyrimidinyl, pyridazinyl and triazinyl, monocyclic rings, polycyclic rings such as phenoxathienyl, indolizinyl, indolyl, purinyl, quinolyl, benzothiazole and carbazolyl, 2-furanyl, N-imidazolyl, 2-isoxazolyl, 2-pyridinyl, and 2-pyrimidinyl, but the present invention is not limited thereto.

The "aryloxy" used herein refers to a monovalent substituent represented by RO—, wherein R refers to aryl having 6 to 20 carbon atoms. Examples of the aryloxy may include phenyloxy, naphthyloxy and diphenyloxy, but the present invention is not limited thereto.

The "alkyloxy" used herein refers to a monovalent substituent represented by R'O—, wherein R' refers to alkyl having 1 to 10 carbon atoms and includes a linear, branched or cyclic structure. Examples of alkyloxy may include methoxy, ethoxy, n-propoxy, 1-propoxy, t-butoxy, n-butoxy, and pentoxy, but the present invention is not limited thereto.

The "cycloalkyl" used herein refers to a monovalent substituent derived from monocyclic or polycyclic non-aromatic hydrocarbon having 3 to 10 carbon atoms. Examples of the cycloalkyl may include cyclopropy, cyclopentyl, cyclohexyl, and norbornyl, but the present invention is not limited thereto.

The "heterocycloalkyl" used herein refers to a monovalent substituent derived from non-aromatic hydrocarbon having 3 to 10 nuclear atoms, and one or more carbons, and preferably, 1 to 3 carbons, of the ring are substituted with a hetero atom such as N, O, S or Se. Examples of the heterocycloalkyl may include morpholine and piperazine, but the present invention is not limited thereto.

Hereinafter, preferable examples of the present invention will be described in detail.

As described above, a photoresist stripper composition for manufacturing a display according to one embodiment of the present invention is as follows:
(a) 0.01 to 3 wt % of a transition metal and metal oxide corrosion inhibitor of Formula 1 below;
(b) 0.05 to 3 wt % of a non-sulfur-based corrosion inhibitor of Formula 2 below;
(c) 1 to 10 wt % of a mixture of a primary amine and a secondary amine;
(d) 1 to 15 wt % of a cyclic alcohol;
(e) 1 to 30 wt % of an aprotic polar organic solvent;
(f) 1 to 30 wt % of a protic polar organic solvent; and
(g) deionized water as the remainder:

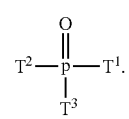

<Formula 1>

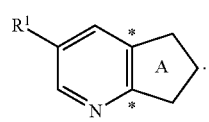

<Formula 2>

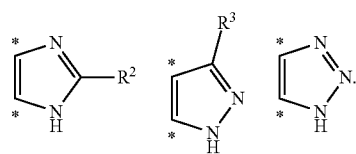

<Formula 3>

Here, $T^1$ and $T^2$ are each independently —O⁻NH₄⁺ or —O—H;

$T^3$ is —O—R or —R';

R and R' are each independently selected from the group consisting of hydrogen, methyl, a linear or branched $C_2$ to $C_{12}$ alkyl group, a linear or branched $C_2$ to $C_{12}$ alkenyl group, a linear or branched $C_2$ to $C_{12}$ alkynyl group, a $C_3$ to $C_{12}$ cycloalkyl group, a heterocycloalkyl group having 3 to 10 nuclear atoms, which includes one or more hetero atoms selected from the group consisting of N, O and S, a $C_6$ to $C_{20}$ aryl group, a heteroaryl group having 5 to 20 nuclear atoms, which includes one or more hetero atoms selected from the group consisting of N, O and S, a $C_1$ to $C_{12}$ alkyloxy group, and a $C_6$ to $C_{12}$ aryloxy group;

ring A of Formula 2 is any one of the structures of Formula 3;

$R^1$, $R^2$ and $R^3$ are selected from the group consisting of methyl, a linear or branched $C_2$ to $C_{12}$ alkyl group, a linear or branched $C_2$ to $C_{12}$ alkenyl group, a linear or branched $C_2$ to $C_{12}$ alkynyl group, a $C_3$ to $C_{12}$ cycloalkyl group, a heterocycloalkyl group having 3 to 10 nuclear atoms, which includes one or more hetero atoms selected from the group consisting of N, O and S, a $C_6$ to $C_{20}$ aryl group, a heteroaryl group having 5 to 20 nuclear atoms, which includes one or more hetero atoms selected from the group consisting of N, O and S, a $C_1$ to $C_{12}$ alkyloxy group, and a $C_6$ to $C_{12}$ aryloxy group; and

* indicates carbon fusing a pyridine ring of Formula 2 and ring A.

According to one embodiment of the present invention, as a transition metal corrosion inhibitor, which is an aluminum corrosion inhibitor, 0.01 to 3 wt % of the above-described alkali phosphate and alkali phosphonic acid of Formula 1 was included. While such a corrosion inhibitor was included to further improve anti-corrosion ability of Mo or Al, it is not necessary to use the corrosion inhibitor in excess, because, when including more than 3 wt %, the corrosion inhibitor affects a stripper and basicity to increase the corrosiveness of copper.

Specifically, a non-sulfur-based compound used in the present invention, inferred from Formulas 2 and 3, is selected from the group consisting of the following compounds:

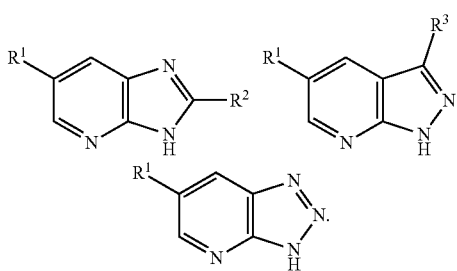

Here, $R^1$, $R^2$ and $R^3$ are as defined in Formulas 2 and 3 above.

According to one embodiment of the present invention, the photoresist stripper is a transition metal corrosion inhibitor, which includes 0.05 to 3 wt % of the above-described non-sulfur-based compound. When the corrosion inhibitor is included at less than 0.05 wt %, a corrosion inhibitory effect on a metal wiring film is lowered, and depending on the type of some amines applied, no corrosion inhibitory effect is exhibited.

Meanwhile, according to one embodiment of the present invention, when the corrosion inhibitor is included at more than 3 wt %, it was confirmed that photoresist stripping ability tends to slightly decrease, but there is no significant change in anti-corrosion ability. However, since the non-sulfur-based compound used in the present invention is generally very expensive, it is not necessary to input the compound at an amount more than necessary.

According to one embodiment of the present invention, as the primary amine compound used in the present invention, any one or more selected from the group consisting of monoethanol amine, monoisopropanol amine, 2-amino-2-methyl-1-propanol and aminoethoxyethanol may be used, but the present invention is not limited thereto.

According to one embodiment of the present invention, as the secondary amine compound used in the present invention, any one or more selected from the group consisting of 2-acetyl ethanol amine, diethanol amine, 2-methylaminoethanol and 2-isopropylaminoethanol may be used, but the present invention is not limited thereto.

According to one embodiment of the present invention, the mixture of a primary amine and a secondary amine used in the present invention is preferably used at 1 to 10 wt % with respect to the total composition. Meanwhile, according to one embodiment of the present invention, in the mixture of a primary amine and a secondary amine, the primary amine content is less than 3 wt % based on the total weight of the composition.

When each of the above-described primary amine and secondary amine is independently used, or the content of the primary amine in the above-described mixture of the amines is 3 wt % or more based on the total weight of the composition, the stripping ability is maintained, but the anti-corrosion ability tends to decline.

Cyclic alcohols are known to reduce the amount of volatilization of the stripper, control the evaporation of an alkanolamine, which is one of the important active ingredients of the composition, to maintain the efficiency of the composition for a long time. The cyclic alcohol that can be used in the present invention may be, for example, a $C_4$ to $C_6$ cyclic alcohol, and preferably any one or more selected from the group consisting of tetrahydrofurfuryl alcohol, furfuryl alcohol, cyclobutanol, cyclopentanol, cyclohexanol and isopropylideneglycerol, but the present invention is not limited thereto.

The cyclic alcohol is preferably included at 1 to 15 wt % with respect to the total composition. Since such a cyclic alcohol is generally very expensive, it is not necessary to input the alcohol at an amount more than necessary.

According to one embodiment of the present invention, it is known that the aprotic polar organic solvent used in the present invention serves to weaken the binding force of a polymer material and easily remove a modified photoresist. In one embodiment of the present invention, as the aprotic polar organic solvent used in the present invention, any one or more selected from the group consisting of dimethylpropionamide, sulfolane, ethylformamide, Equamide, 1,3-dimethyl-2-imidazolidinone, 2-pyrrolidone and 1-formylpiperidine, and a mixture thereof may be used, but the present invention is not limited thereto.

The polar organic solvent is preferably included at 1 to 30 wt % with respect to the total composition.

According to one embodiment of the present invention, as the protic polar organic solvent, a mixture of one or more types of glycol-based compounds may be used, and this is known to effectively aid in the stripping of a photoresist. In addition, the glycol-based compound serves to easily disperse the dissolved photoresist in a stripper to help rapidly remove the photoresist.

According to one embodiment of the present invention, as the glycol-based compound used in the present invention, $C_1$ to $C_6$ alkylene glycol, a $C_1$ to $C_6$ alkyl ether-based compound of $C_1$ to $C_6$ alkylene glycol, or a $C_1$ to $C_6$ alkyl ether acetate-based compound of $C_1$ to $C_6$ alkylene glycol may be used alone or in combination, but the present invention is not limited thereto. According to one embodiment of the present invention, as the $C_1$ to $C_6$ alkylene glycol used in the present invention, ethylene glycol, propylene glycol, or butylene glycol may be used alone or in combination, but the present invention is not limited thereto.

According to one embodiment of the present invention, the $C_1$ to $C_6$ alkyl ether-based compound of $C_1$ to $C_6$ alkylene glycol used in the present invention may be ethylene glycol monomethyl ether, ethylene glycol monoethyl ether, ethylene glycol monopropyl ether, ethylene glycol monoisopropyl ether, ethylene glycol monobutyl ether, ethylene glycol monophenyl ether, ethylene glycol monobenzyl ether, diethylene monoglycol methyl ether, diethylene monoglycol ethyl ether, diethylene glycol diethyl ether, diethylene glycol monobutylene ether, diethylene glycol dibutyl ether, dipropylene glycol monomethyl ether, dipropylene glycol dimethyl ether, dipropylene glycol monobuty ether, dipropylene glycol dibutyl ether, triethylene glycol monomethyl ether, triethylene glycol dimethyl ether, triethylene glycol monoethyl ether, triethylene glycol diethyl ether, triethylene glycol monobutyl ether, or triethylene glycol dibutyl ether, which may be used alone or in combination, but the present invention is not limited thereto.

According to one embodiment of the present invention, the $C_1$ to $C_6$ alkyl ether acetate-based compound of $C_1$ to $C_6$ alkylene glycol used in the present invention may be ethylene glycol methyl ether acetate, ethylene glycol monoethyl ether acetate, ethylene glycol monobutyl ether acetate, or propylene glycol monomethyl ether acetate, which may be used alone or in combination, but the present invention is not limited thereto.

According to one embodiment of the present invention, more preferably, diethylene glycol monomethyl ether (MDG), diethylene glycol monoethyl ether (EDG), diethylene glycol monobutyl ether (BDG), triethylene glycol ether (TEG), ethylene glycol (EG), or propylene glycol (PG) may be used as a glycol-based compound.

The glycol-based compound is preferably included at 1 to 30 wt % with respect to the total composition.

The photoresist stripper composition according to the present invention is an aqueous type containing water. The aqueous-type stripper containing water has more activated basicity than an organic stripper. Accordingly, in the process for a flat display panel, the aqueous-type stripper has an exceptional ability of removing a modified photoresist remaining after the progression of a hard baking process, an implantation process and a dry etching process, compared to a generally used stripper for manufacturing an organic display.

The application of a low process temperature enables a reduction in production costs of the flat display panel. In addition, the optimal corrosion inhibitor for the stripper composition of the present invention may be applied to both aluminum and copper wirings, and may be introduced to an organic film and a COA process.

Hereinafter, the present invention will be described in more detail with reference to examples. The examples are merely provided to more fully describe the present invention, and it will be obvious to those of ordinary skill in the art that the scope of the present invention is not limited to the following examples.

Experimental Example 1

Evaluation of Metal Corrosion and Stripping of Modified Photoresist

A test for measuring modified photoresist stripping ability and corrosion inhibiting ability to evaluate the performance of a photoresist stripper composition of the present invention was performed by the following method. The stripper composition of the present invention was prepared by including a corrosion inhibitor including a non-sulfur-based compound, and specific components and contents are listed in Table 1 below. Specific components and contents of the compositions prepared according to Comparative Examples are listed in Table 2.

More specifically, a metal-film wiring glass substrate from which a photoresist is not removed was manufactured by thermal treatment in an oven at 160° C. While the prepared stripper composition was maintained at a predetermined temperature, the manufactured substrate was immersed in the stripper composition for the same time to evaluate the degree of removal of a modified photoresist. In addition, while the stripper composition was maintained at a predetermined temperature, a Cu wiring film by immersing the Cu metal-film wiring glass substrate in the stripper composition for the same time to evaluate whether the Cu wiring film was corroded.

The experimental result is shown in Table 3 based on the following criteria.

[Modified Photoresist Stripping Ability]
⊚: The modified photoresist was completely removed.
Δ: Traces of the modified photoresist remained.
X: 30% or more of the modified photoresist remained.

[Degree of Cu Wiring Corrosion]
⊚: Corrosion was not observed on the surface of the metal film at the same level as the reference.
Δ: The thickness of the metal film did not decrease, but an abnormality was observed on the surface.
X: The thickness of the metal film was reduced and an abnormality was observed on the surface.

The abbreviations of the compounds used in the present invention are as follows:
MIPA: monoisopropanol amine
AEE: 2-(2-aminoethoxy) ethanol
DEA: diethanolamine
NMEA: N-methylethanolamine
IPG: 1,2-isopropylideneglycerol
EDG: diethylene glycol monoethyl ether
DMPA: N,N-dimethylpropionamide
NEF: N-ethylformamide
BPA: butylphosphonic acid
HPA: hexylphosphonic acid
PD-A: 5-methyl imidazol[1,2-a]pyridine-2-carboxylic acid
PD-B: 3-methyl-1H-pyrazolo[3,4-b]pyridine
PD-C: 1,2,3-triazolo[4,5-b]pyridine
MMI: mercaptomethylimidazole
MBI: mercaptobenzimidazole
MBO: mercaptobenzoxazole

TABLE 1

| | Composition | Amine compound | | | | Cyclic alcohol | Protic organic solvent | Aprotic organic solvent | Deionized water | Corrosion inhibitor | | Total content |
|---|---|---|---|---|---|---|---|---|---|---|---|---|
| | | Primary | Content | Secondary | Content | | | | | Al | Cu | |
| Example | 1 | MIPA | 2% | DEA | 8% | IPG 10% | EDG 29.7% | DMPA 20% | 30.00% | BPA | PD-A | 0.30% |
| | 2 | MIPA | 1% | DEA | 9% | IPG 10% | EDC 29.7% | DMPA 20% | 30.00% | BPA | PD-B | 0.30% |
| | 3 | MIPA | 2% | NMEA | 8% | IPG 10% | EDG 29.7% | DMPA 20% | 30.00% | BPA | PD-B | 0.30% |
| | 4 | MIPA | 1% | NMEA | 9% | IPG 10% | EDC 29.7% | DMPA 20% | 30.00% | HPA | PD-C | 0.30% |
| | 5 | MIPA | 1% | NMEA | 5% | IPG 10% | EDG 33.7% | DMPA 20% | 30.00% | HPA | PD-C | 0.30% |
| | 6 | AEE | 2% | DEA | 8% | IPG 10% | EDG 29.7% | NEF 20% | 30.00% | BPA | PD-A | 0.30% |
| | 7 | AEE | 1% | DEA | 9% | IPG 10% | EDG 29.7% | NEF 20% | 30.00% | BPA | PD-B | 0.30% |
| | 8 | AEE | 2% | NMEA | 8% | IPG 10% | EDG 29.7% | NEF 20% | 30.00% | BPA | PD-B | 0.30% |
| | 9 | AEE | 1% | NMEA | 9% | IPG 10% | EDG 29.7% | NEF 20% | 30.00% | HPA | PD-C | 0.30% |
| | 10 | AEE | 1% | NMEA | 5% | IPG 10% | EDG 33.7% | NEF 20% | 30.00% | HPA | PD-C | 0.30% |

TABLE 2

| | Composition | Amine compound | | | | Cyclic alcohol | Protic organic solvent | Aprotic organic solvent | Deionized water | Corrosion inhibitor | | Total content |
|---|---|---|---|---|---|---|---|---|---|---|---|---|
| | | Primary | Content | Secondary | Content | | | | | Al | Cu | |
| Comparative Example | 11 | MIPA | 2% | DEA | 8% | IPG 10% | EDG 29.7% | DMPA 20% | 30.00% | BPA | MBI | 0.30% |
| | 12 | MIPA | 1% | DEA | 9% | IPG 10% | EDG 29.9% | DMPA 20% | 30.00% | BPA | MBO | 0.30% |
| | 13 | MIPA | 2% | NMEA | 8% | IPG 10% | EDG 29.7% | DMPA 20% | 30.00% | BPA | MMI | 0.30% |
| | 14 | MIPA | 1% | NMEA | 9% | IPG 10% | EDG 29.7% | DMPA 20% | 30.00% | HPA | MBI | 0.30% |
| | 15 | MIPA | 1% | NMEA | 5% | IPG 10% | EDG 33.7% | DMPA 20% | 30.00% | HPA | MBO | 0.30% |
| | 16 | AEE | 2% | DEA | 8% | IPG 10% | EDG 29.7% | NEF 20% | 30.00% | BPA | MMI | 0.30% |
| | 17 | AEE | 1% | DEA | 9% | IPG 10% | EDG 29.7% | NEF 20% | 30.00% | BPA | MBI | 0.30% |
| | 18 | AEE | 2% | NMEA | 8% | IPG 10% | EDG 29.7% | NEF 20% | 30.00% | BPA | MBO | 0.30% |
| | 19 | AEE | 1% | NMEA | 9% | IPG 10% | EDG 29.7% | NEF 20% | 30.00% | HPA | MMI | 0.30% |
| | 20 | AEE | 1% | NMEA | 5% | IPG 10% | EDG 33.7% | NEF 20% | 30.00% | HPA | MBI | 0.30% |
| | 21 | MIPA | 2% | DEA | 8% | IPG 10% | EDG 29.7% | DMPA 20% | 30.27% | BPA | PD-A | 0.03% |
| | 22 | AEE | 2% | DEA | 8% | IPG 10% | EDG 29.7% | NEF 20% | 30.25% | BPA | PD-A | 0.05% |
| | 23 | MIPA | 3% | NMEA | 7% | IPG 10% | EDG 29.7% | DMPA 20% | 29.95% | HPA | PD-B | 0.30% |
| | 24 | AEE | 3% | NMEA | 7% | IPG 10% | EDG 29.7% | NEF 20% | 30.22% | HPA | PD-B | 0.30% |
| | 25 | MIPA | 6% | — | — | IPG 10% | EDG 33.7% | DMPA 20% | 30.00% | BPA | PD-C | 0.30% |
| | 26 | — | — | NMEA | 8% | IPG 10% | EDG 33.7% | NEF 20% | 30.00% | BPA | PD-C | 0.30% |

TABLE 3

| (Example) Composition | 1 | 2 | 3 | 4 | 5 | 6 | 7 | 8 | 9 | 10 |
|---|---|---|---|---|---|---|---|---|---|---|
| Result of stripping evaluation | ◎ | ◎ | ◎ | ◎ | ◎ | ◎ | ◎ | ◎ | ◎ | ◎ |
| Result of corrosion evaluation | ◎ | ◎ | Δ | ◎ | ◎ | ◎ | ◎ | Δ | ◎ | ◎ |

| (Comparative Example) Composition | 11 | 12 | 13 | 14 | 15 | 16 | 17 | 18 | 19 | 20 |
|---|---|---|---|---|---|---|---|---|---|---|
| Result of stripping evaluation | Δ | Δ | Δ | Δ | Δ | ◎ | Δ | ◎ | Δ | Δ |
| Result of corrosion evaluation | X | X | X | X | X | Δ | X | X | X | X |

| (Comparative Example) Composition | 21 | 22 | 23 | 24 | 25 | 26 | — | — | — | — |
|---|---|---|---|---|---|---|---|---|---|---|
| Result of stripping evaluation | ◎ | ◎ | ◎ | ◎ | ◎ | X | — | — | — | — |
| Result of corrosion evaluation | X | Δ | X | X | X | ◎ | — | — | — | — |

As shown in Table 3, in the case of a stripper including the non-sulfur-based compound of the present invention as a corrosion inhibitor, it can be confirmed that the anti-corrosion ability and photoresist stripping ability are improved compared to when an existing sulfur-based corrosion inhibitor was used.

In addition, as seen from the results of Examples and Comparative Examples 25 and 26, rather than using a primary amine or a secondary amine alone, the use of a mixture thereof is preferable for anti-corrosion ability, and as shown in Comparative Examples 23 and 24, when the content of the primary amine of the amine mixture is 3 wt % or more based on the total weight of the composition, the stripping ability is maintained, but the anti-corrosion ability tends to decline.

In addition, as shown in Comparative Example 21, it can be confirmed that even when the content of the non-sulfur-based compound used as a corrosion inhibitor is 0.05% or less, poor corrosion inhibiting performance can be confirmed.

Experimental Example 2

Evaluation of Surface Roughness with Respect to Metal Corrosion

Generally, to evaluate metal corrosion, the degree of corrosion was observed using FE-SEM. To confirm more precise metal corrosion performance, a high-performance roughness meter (confocal microscope) was used for the evaluation. The analyzer will be simply described as follows.

The confocal microscope is a non-contact analyzer that measures surface roughness through higher resolution compared to a conventional optical microscope. There are reflective and transmissive lighting methods, and the type used for industrial purposes is mainly a reflective type. Accordingly, a high-resolution image focused on the front field of view for a sample surface with irregularities can be obtained, and it is also possible to measure a 3-dimensional shape in a non-destructive and non-contact manner.

Therefore, an even more precise corrosion performance level can be confirmed by measuring the surface roughness of a copper (Cu) wiring pattern edge part vulnerable to corrosion after dry etching.

The abbreviations used in the experiment are as follows.
S—(Sv, Sz, Sa): surface roughness
R—(Rv, Rz, Ra): profile roughness
-v (Sv, Rv): maximum valley height
-z (Sz, Rz): 10-point average roughness (ten-point height)
-a (Sa, Ra): center line average Similar levels of compositions of Examples and Comparative Examples described above are as follows.

TABLE 4

| Composition | Amine compound | | | | Cyclic alcohol | Protic organic solvent | Aprotic organic solvent | Deionized water | Corrosion inhibitor | | Total content |
| | Primary | Content | Secondary | Content | | | | | Al | Cu | |
| --- | --- | --- | --- | --- | --- | --- | --- | --- | --- | --- | --- |
| Example 3 | MIPA | 2% | NMEA | 8% | IPG 10% | EDG 29.7% | DMPA 20% | 30.00% | BPA | PD-B | 0.30% |
| Example 8 | AEE | 2% | NMEA | 8% | IPG 10% | EDG 29.7% | NEF 20% | 30.00% | BPA | PD-B | 0.30% |
| Comparative Example 16 | AEE | 2% | DEA | 8% | IPG 10% | EDG 29.7% | NEF 20% | 30.00% | BPA | MMI | 0.30% |
| Comparative Example 22 | AEE | 2% | DEA | 8% | IPG 10% | EDG 29.7% | NEF 20% | 30.25% | BPA | PD-A | 0.05% |

TABLE 5

| Composition | Measurement site classification | Sv (Rv) | Sz (Rz) | Sa (Ra) |
| --- | --- | --- | --- | --- |
| Example 3 | Surface roughness-1 | 0.026 | 0.049 | 0.006 |
| | Surface roughness-2 | 0.020 | 0.031 | 0.003 |
| | Profile roughness | 0.005 | 0.011 | 0.002 |
| Example 8 | Surface roughness-1 | 0.018 | 0.056 | 0.003 |
| | Surface roughness-2 | 0.028 | 0.039 | 0.004 |
| | Profile roughness | 0.011 | 0.039 | 0.003 |
| Comparative Example 16 | Surface roughness-1 | 0.073 | 0.118 | 0.013 |
| | Surface roughness-2 | 0.066 | 0.109 | 0.013 |
| | Profile roughness | 0.040 | 0.070 | 0.013 |
| Comparative Example 22 | Surface roughness-1 | 0.042 | 0.082 | 0.011 |
| | Surface roughness-2 | 0.054 | 0.097 | 0.010 |
| | Profile roughness | 0.030 | 0.031 | 0.011 |

In addition, FIGS. 1 and 2 are images that can be shown with the measurement of surface roughness. FIG. 1 corresponds to Example 8, and FIG. 2 corresponds to Comparative Example 16.

As seen from Table 5, it can be confirmed that the compositions of Examples according to the present invention show lower levels of roughness than the compositions of Comparative Examples. Accordingly, when the composition of the present invention is used as a stripper, it can be confirmed that the anti-corrosion ability is further improved.

In the above, the present invention was described with reference to embodiments. It will be understood by those of ordinary skill in the art that the present invention can be implemented in modified forms without departing from the essential features of the present invention.

The invention claimed is:

1. A photoresist stripper composition for manufacturing a display, comprising:
  (a) 0.01 to 3 wt % of a transition metal and a metal oxide corrosion inhibitor;
  (b) 0.05 to 3 wt % of a non-sulfur-based corrosion inhibitor;
  (c) 1 to 10 wt % of a mixture of a primary amine and a secondary amine;
  (d) 1 to 15 wt % of a cyclic alcohol;
  (e) 1 to 30 wt % of an aprotic polar organic solvent;
  (f) 1 to 30 wt % of a protic polar organic solvent; and
  (g) deionized water as the remainder,
  wherein the transition metal and a metal oxide corrosion inhibitor is one or more selected from the group consisting of monoammonium phosphate, diammonium phosphate, triammonium phosphate, methylphosphonic acid, ethylphosphonic acid, propylphosphonic acid, butylphosphonic acid, tert-butyl phosphonic acid, pentyphosphonic acid, n-hexylphosphonic acid, triethyl phosphate, octylphosphonic acid, decylphosphonic acid, dodecylphosphonic acid, tetradecylphosphonic acid, octadecylphosphonic acid, hexylphosphate, heptylphosphate, octylphosphate, nonylphosphate, decylphosphate, and dodecylphosphate,
  wherein the non-sulfur-based corrosion inhibitor is any one or more selected from the group consisting of imidazo[4,5-b]pyridine, 6-methylimidazo[4,5-b]pyridine, imidazo[4,5-b]pyridine-2-carboxylic acid, 6-methylimidazo[4,5-b]pyridine-2-carboxylic acid, 1H-pyrazolo[3,4-b]pyridine, 3-methyl-1H-pyrazolo[3,4-b]pyridine, 1H-pyrazolo[3,4-b]pyridine-3-carboxylic acid, and 5-methyl-1H-pyrazolo[3,4-b]pyridine-3-carboxylic acid, and
  wherein the content of the primary amine in the mixture of the primary amine and the secondary amine is less than 3 wt % based on the total weight of the composition.

2. The composition of claim 1, wherein the primary amine is selected from the group consisting of monoethanol amine, monoisopropanol amine, 2-amino-2-methyl-1-propanol, aminoethoxyethanol, and a mixture thereof.

3. The composition of claim 1, wherein the secondary amine is selected from the group consisting of 2-acetyl ethanol amine, diethanol amine, 2-methylaminoethanol, 2-isopropylaminoethanol, and a mixture thereof.

4. The composition of claim 1, wherein the cyclic alcohol is selected from the group consisting of tetrahydrofurfuryl alcohol, furfuryl alcohol, isopropylidene glycerol, and a mixture thereof.

5. The composition of claim 1, wherein the aprotic polar organic solvent is selected from the group consisting of dimethyl propionamide, sulfolane, ethylformamide, 1,3-dimethyl-2-imidazolidinone, 2-pyrrolidone, 1-formylpiperidine, and a mixture thereof.

6. The composition of claim 1, wherein the protic polar organic solvent is any one or more selected from the group consisting of ethylene glycol, propylene glycol, diethylene glycol monoethyl ether, diethylene glycol monobutyl ether (BDG), diethylene glycol monomethyl ether, ethylene glycol monoethyl ether, ethylene glycol monobutyl ether, propylene glycol monomethyl ether, propylene glycol monoethyl ether, propylene glycol monobutyl ether, diethylene glycol monoethyl ether, diethylene glycol monopropyl ether, diethylene glycol monobutyl ether, dipropylene glycol monomethyl ether, dipropylene glycol monoethyl ether, dipropylene glycol monopropyl ether, dipropylene glycol monobutyl ether, triethylene glycol monopropyl ether, triethylene glycol monobutyl ether, triethylene glycol monomethyl ether, tripropylene glycol monoethyl ether, tripropylene glycol monopropyl ether, and tripropylene glycol monobutyl ether.

\* \* \* \* \*